US012800625B2

(12) United States Patent
Kavousian et al.

(10) Patent No.: US 12,800,625 B2

(45) Date of Patent: Nov. 17, 2026

(54) DEVICE HAVING INTEGRATED CURRENT SENSORS

(71) Applicant: Google LLC, Mountain View, CA (US)

(72) Inventors: Amirpouya Kavousian, San Jose, CA (US); Nathan Michael Pletcher, Mountain View, CA (US)

(73) Assignee: Google LLC, Mountain View, CA (US)

(*) Notice: Subject to any disclaimer, the term of this patent is extended or adjusted under 35 U.S.C. 154(b) by 464 days.

(21) Appl. No.: 18/693,040

(22) PCT Filed: Sep. 20, 2021

(86) PCT No.: PCT/US2021/051106

§ 371 (c)(1),
(2) Date: Mar. 18, 2024

(87) PCT Pub. No.: WO2023/043463

PCT Pub. Date: Mar. 23, 2023

(65) Prior Publication Data

US 2025/0004021 A1 Jan. 2, 2025

(51) Int. Cl.
*G01R 19/25* (2006.01)
*G01R 19/00* (2006.01)
(Continued)

(52) U.S. Cl.
CPC ....... *G01R 19/2513* (2013.01); *G01R 19/003* (2013.01); *G01R 19/0053* (2013.01);
(Continued)

(58) Field of Classification Search
None
See application file for complete search history.

(56) References Cited

U.S. PATENT DOCUMENTS 8,346,496 B1 1/2013 Brecht et al.
2002/0093314 A1 7/2002 Ashtiani et al.
(Continued)

FOREIGN PATENT DOCUMENTS

CN 104953827 A 9/2015
JP 2001521159 A 11/2001
(Continued)

OTHER PUBLICATIONS

"Foreign Office Action", JP Application No. 2024-517538, May 7, 2025, 13 pages.
(Continued)

*Primary Examiner* — Jas A Sanghera
(74) *Attorney, Agent, or Firm* — Colby Nipper PLLC

(57) ABSTRACT

Disclosed herein are integrated current sensors and methods for sensing and measuring current consumption of electronic devices. The electronic device can comprise: a plurality of layers within a power delivery network of the device, each tile comprising circuitry for performing one or more functions; a plurality of probes, each probe having a pair of inputs connected to portions of one or more layers having a voltage drop, wherein each probe is configured to convert a respective differential voltage to a representative current passing through the one or more layers; a capacitor that is configured to integrate the respective currents passing through the one or more layers to an integrated voltage; and a converter that is configured to generate a measure of current consumed by the device based on the integrated voltage.

20 Claims, 5 Drawing Sheets

(51) Int. Cl.
*G01R 19/10* (2006.01)
*G01R 22/08* (2006.01)

(52) U.S. Cl.
CPC ......... *G01R 19/0092* (2013.01); *G01R 19/10* (2013.01); *G01R 19/2509* (2013.01); *G01R 22/08* (2013.01)

(56) References Cited

U.S. PATENT DOCUMENTS

| | | | | |
|---|---|---|---|---|
| 2013/0162269 | A1 | 6/2013 | Julicher | |
| 2014/0239932 | A1 | 8/2014 | Galinski | |
| 2015/0331019 | A1* | 11/2015 | Yamamura | G01R 19/255 702/64 |
| 2016/0020004 | A1* | 1/2016 | Kampl | G01R 1/203 29/620 |
| 2017/0269152 | A1* | 9/2017 | Jenkins | G01R 31/2858 |

FOREIGN PATENT DOCUMENTS

| | | | |
|---|---|---|---|
| JP | 2003142954 | A | 5/2003 |
| JP | 2004138482 | A | 5/2004 |
| JP | 2008216270 | A | 9/2008 |
| JP | 2010123736 | A | 6/2010 |
| JP | 2014119315 | A | 6/2014 |
| JP | 2015222176 | A | 12/2015 |
| JP | 2018072309 | A | 5/2018 |
| JP | 2018536166 | A | 12/2018 |
| KR | 20160028593 | A | 3/2016 |
| KR | 20160045954 | A | 4/2016 |
| TW | 1521338 | B | 2/2016 |

OTHER PUBLICATIONS

"Foreign Office Action", KR Application No. 10-2024-7011392, Jun. 9, 2025, 14 pages.
"Foreign Office Action", IN Application No. 202447031100, Mar. 16, 2026, 8 pages.
Wang, et al., "Multi-site On-chip Current Sensor for Electromigration Monitoring", Aug. 2011, 4 pages.
"International Search Report and Written Opinion", Application No. PCT/US2021/051106, Jun. 14, 2022, 16 pages.
"Simplifying Current Sensing How to Design with Current Sense Amplifiers", Retrieved at: http://ti.com/lit/eb/slyy154a/slyy154a.pdf?ts=1620543359071&ref_url=https%253A%252F%252Fwww.ti.com%252Famplifier-circuit%252Fcurrent-sense%252Fsupport-training.html—on Aug. 1, 2024, 58 pages.
Goodenough, F, "Integrator IC Converts Picoamperes to Volts", Jun. 13, 2021, 3 pages.
Shi, et al., "Runtime Resonance Noise Reduction with Current Prediction Enabled Frequency Actuator", Mar. 2011, 5 pages.

* cited by examiner

DEVICE HAVING INTEGRATED CURRENT SENSORS

CROSS-REFERENCE TO RELATED APPLICATION

This application is a National Stage Application under 35 U.S.C. § 371 and claims the benefit of International Application No. PCT/US2021/051106, filed Sep. 20, 2021, the disclosure of which is incorporated herein by reference.

BACKGROUND

This specification relates to current sensors of electronic devices.

A current sensor is a circuitry integrated on or external to an electronic device and measures and estimates currents of the electronic device, e.g., a chip. Current sensing and measurement on an electronic device is essential to meet the thermal and current limits and ensure proper functioning of the electronic device. Current sensing and estimation can also facilitate planning of concurrent running of different computational tasks on the electronic device.

Current sensing and measurement on integrated electronic devices can be performed using a sensor external to the electronic device or an estimator that is integrated into the device, but these techniques suffer from fundamental drawbacks.

For example, external current sensors can be slow in generating measurements and may require additional electronic elements such as sensing resistors, which may increase the bill-of-material (BOM) cost of the electronic device. In addition, external current sensors may cause a voltage drop over the sensing resistors thus reducing the power efficiency of the electronic device.

Current sensors integrated into the device, such as an event power estimator, may lack accuracy in measuring currents due to its approximation of the current based on a finite set of pre-characterized computation events. In addition, actual current may not match these pre-characterized events.

SUMMARY

This specification describes integrated current sensors that are part of the electronic device. The integrated current sensors described in this specification achieve more accurate current sensing without adding substantial additional manufacturing costs and without causing additional voltage drops by utilizing existing power delivery network (PDN) of the device as part of its circuitry. In particular, the integrated current sensors can utilize resistors in the PDN for sensing the currents while the resistors are simultaneously used for pre-existing functions of the PDN.

The integrated current sensors can include multiple probes, and each probe can convert a voltage drop at a resistor to a measure of current. The integrated current sensor can include a current-processing block that integrates the converted currents with a sensing capacitor to produce an integrated voltage. The current processing block can also include a converter that samples and digitizes the integrated voltage to produce measurements and estimations of the current consumed by some or all portions of the electronic device.

The integrated current sensors disclosed herein advantageously utilize multiple voltage drops of resistors that already exist in the PDN of the electronic device and simultaneously facilitate power delivery from a power supply to the load of electronic device, e.g., from where the on-chip PDN starts to where the PDN ends and provides head switches for connecting to the load. Thus, the integrated current sensors disclosed herein reduce manufacturing costs relative to existing current sensors. The integrated current sensors also decrease or eliminate voltage drop relative to traditional current sensing devices and methods, thereby improving power efficiency and power performance of the device. Additionally, the integrated current sensors described herein allow smaller voltages to be used relative to conventional devices, e.g., on a scale of 0.1 millivolts. This allows greater flexibility in selecting different types of resistors for current sensing and measurement. The flexibility in selecting different resistors can facilitate current sensing for various purposes, e.g., sensing of a particular region of the device or sensing while a specific computational task is being performed, to name just a few examples. Further, the integrated current sensors integrate signals that travel differentially in the current domain so that the impact of noise coupling in the signal being sensed is reduced when compared with traditional power estimation methods. Furthermore, the current processing block of the integrated current sensor can advantageously filter out high frequency components, e.g., noise, without affecting the low frequency components of the currents.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes integrated current sensors for measuring and estimating current consumption of a device, e.g., an electronic device. Instead of using any current sensor external to the electronic device or adding additional sensing elements that may generate additional voltage drop(s) to the electronic device, the integrated current sensors disclosed herein can utilize existing resistors in the PDN of the electronic device without interfering with the functioning of the existing resistors with the PDN. The integrated current sensors can include multiple probes, and each probe can convert a voltage drop at a resistor into a current to be integrated. The integrated current sensor can integrate the currents by using a sensing capacitor to generate an integrated voltage. The integrated current sensors can also include a converter that samples and digitizes the integrated voltage to produce a measurement or estimation of the current consumed by the electronic device.

The details of one or more embodiments of the subject matter disclosed herein are set forth in the accompanying drawings and the detailed description. Other features, aspects, and advantages of the subject matter will become apparent from the description, the drawings, and the claims.

Figure 1:
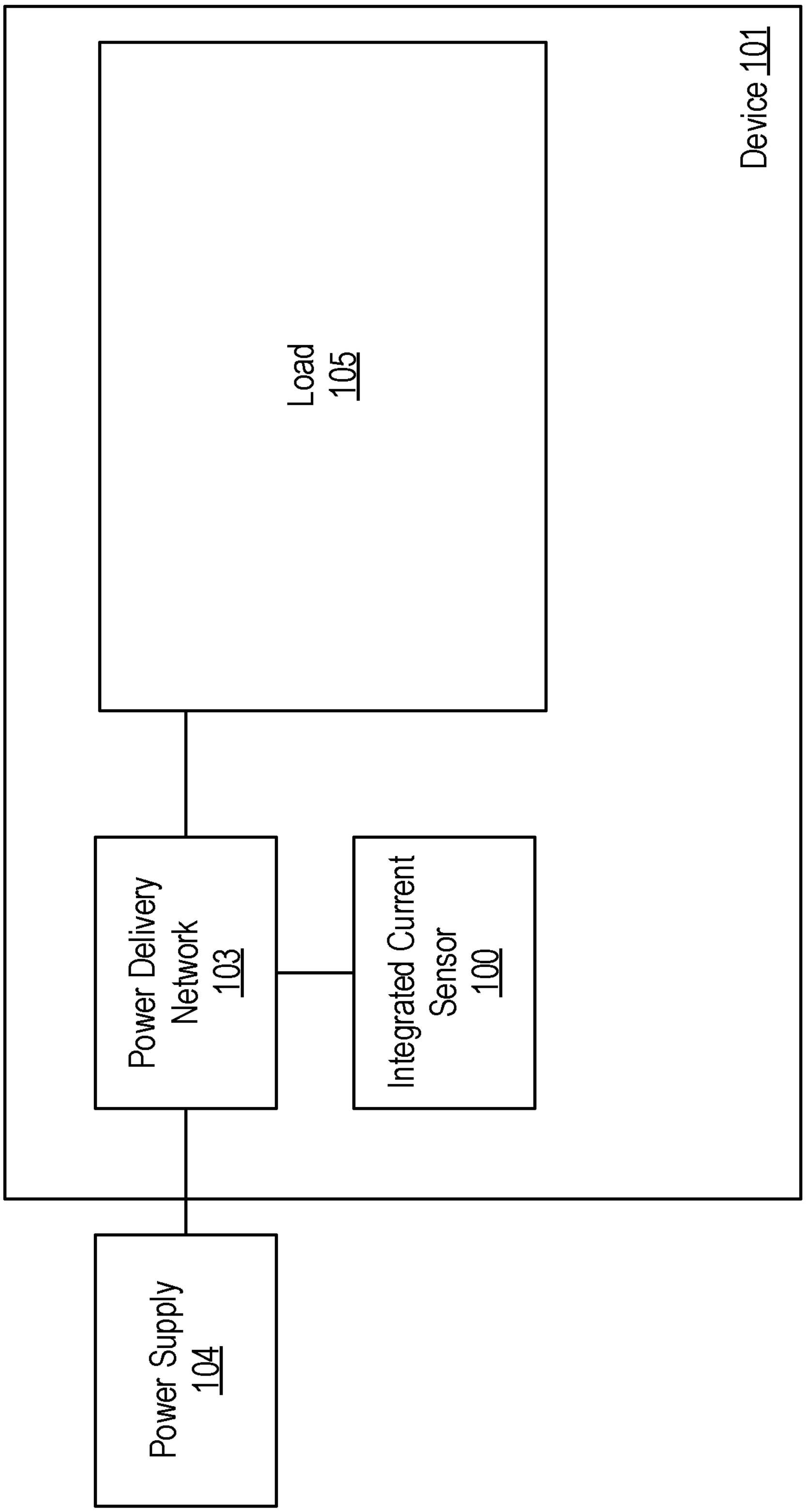
FIG. 1 is a diagram of an example device having an integrated current sensor.

FIG. 1 is a diagram of an example device having an integrated current sensor. The device 101 can be any electronic device that includes an integrated circuit. For example, the device 101 can be a chip, a microprocessor, a central processing unit (CPU), a graphics processing unit (GPU), or a tensor processing unit (TPU), to name just a few examples. In some implementations, the device 101 can be a system on a chip (SOC). The SOC can be an integrated circuit that includes each component of the system on a single silicon substrate or on multiple interconnected dies, e.g., using silicon interposers, stacked dies, or interconnect bridges.

The device 101 can include a power delivery network (PDN) 103 that connects an external power supply 104 to the load 105 of the device 101 so that the load 105 can consume power to perform one or more functions of the electronic device 101. Such functions can include but are not limited to different computational tasks. Besides its function to deliver power to the load 105, the PDN 103 also can consume power. The amount of power consumed by the PDN 103 but not by the load 105 can be considered as power overhead of the device 101 for performing the functions. Power overhead can be considered as power that is wasted, not directly consumed by the load 105, or not consumed directly in performing the function(s) of the device 101.

The device 101 can include an integrated current sensor 100. The integrated current sensor can utilize multiple electronic elements, e.g., resistors, within the PDN 103 to achieve current sensing of at least part of the load 105 in the device 101 without interfering with existing function(s) of such multiple electronic elements within the PDN 103. In other words, such multiple electronic elements can facilitate power delivery to the load 105 and simultaneously enable current sensing by the integrated current sensor 100. The currents being sensed by the integrated current sensor 100 can be indicative of the currents being consumed by at least part of the load 105, so that the total current consumption at the load 105 can be computed based on the current sensed by the integrated current sensor 100. In some cases, the integrated current sensor 100 does not pass current to the load 105. In some cases, the integrated current sensor 100 can be connected to the load directly by passing current(s) directly to the load 105.

The integrated current sensor 100 may be physically located on a same single silicon substrate or on the same multiple interconnected dies with the rest of the device 101. Thus it can be an integral part of the device that is not external to the device 101.

The power supply 104 can be any appropriate source that provides power to the device 101. In this example, the power supply 104 is external to the device 101. The power supply can be turned on and off. The power source can be connected to or disconnected from the device 101.

The device 101 can include a load 105 that actively consumes power to perform one or more functions of the device 101, e.g., one or more computational tasks. The load 105 can include multiple electronic elements including but not limited to a cache, communications fabric, a control unit, an arithmetic and logic unit, a graphics and compute array, and a graphics memory controller, to name just a few examples. The electronic elements within the load can but need not be part of the PDN 103 or the integrated current sensor 100.

Figure 2:
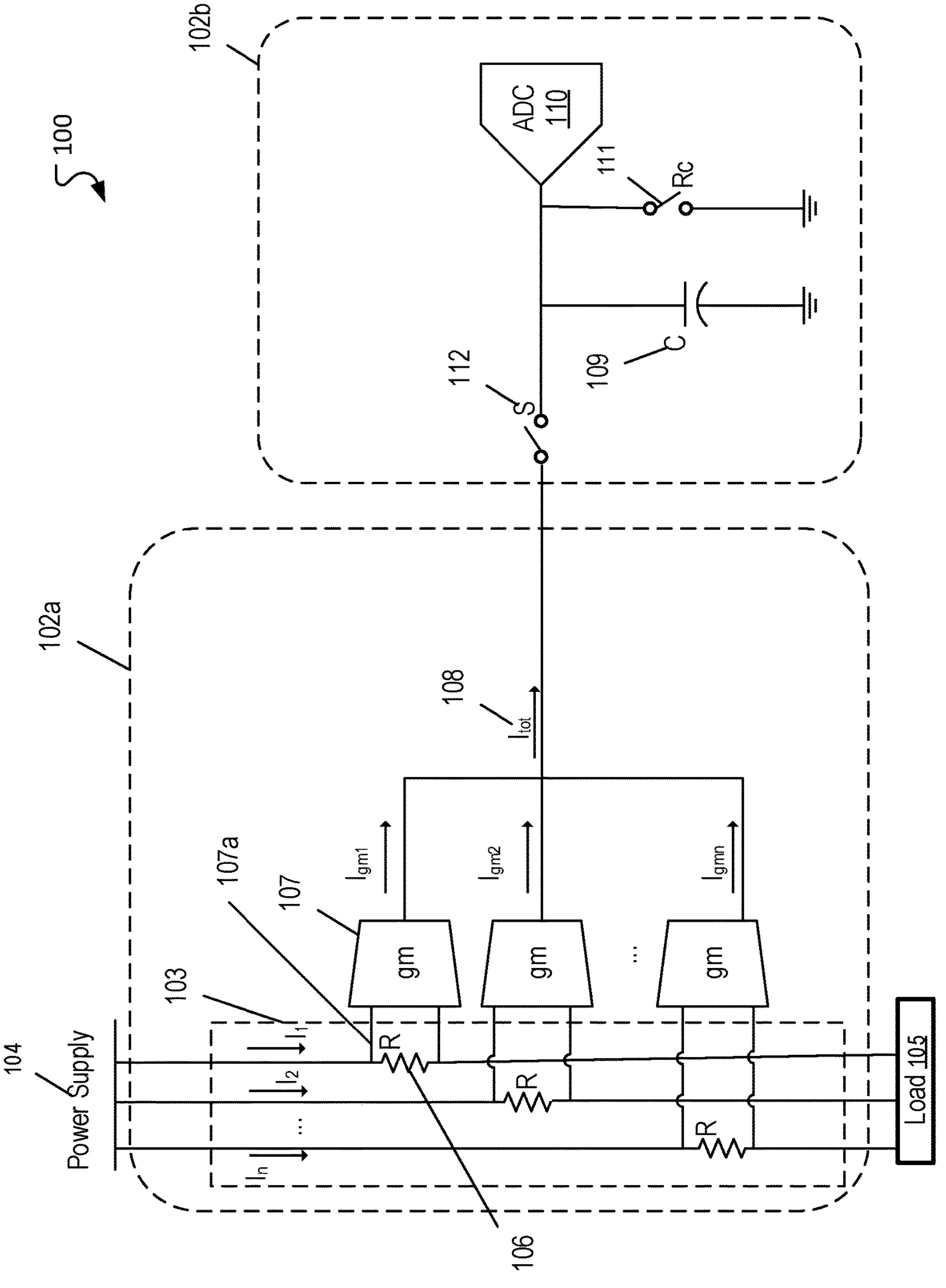
FIG. 2 is a diagram of an example integrated current sensor.

FIG. 2 is a diagram of an example integrated current sensor. In this particular example, the integrated current sensor 100 can include a current sensing block 102*a* and a current processing block 102*b* that are electronically connected with each other. Both of the current sensing block 101 and the current processing block 102*b* can be physically located within the device 101, or in other words, integrated within the device 101.

The current sensing block 102*a* can include multiple probes 107. Each probe 107 can include a pair of inputs 107*a* connected to two portions of the PDN 103 having a voltage drop. For example, the pair of inputs 107*a* can be connected to ends of a pre-selected resistor 106, $R_i$, in the PDN 103, thus the different voltage can be computed according to:

$$V_i = I_i R_i \tag{1}$$

where i=1, . . . , n, n is a non-zero integer that represents the number of resistors of the integrated current sensor 100. For example, the number n can be the total number resistors within the PDN whose voltage drops meet predetermined converting threshold of the probes. As another example, the number n can be pre-set based on the computational task(s) the device performs.

The resistors 106, $R_i$, can but not need to be of identical resistance. For example, the resistors $R_i$ can deviate from a pre-set resistance with a tolerable error, e.g., an error about less than +1%, ±10%, or any other appropriate percentage, to a pre-set resistance. In some implementations, the resistors $R_i$ 106 can vary due to different thermal conditions within portions of the PDN 103. The resistors 106, when there is a current running therethrough, can have a differential voltage $V_i$ between its two ends that functions, and that differential voltage can facilitate power delivery from the power supply 104 to the load 105. Such differential voltages can also be utilized as inputs to the probes 107 of the integrated current sensor 100 for current sensing.

The currents, $I_i$, where i=1, . . . , n, can be in parallel to each other. For example, each of the currents, $I_i$, can run from the power supply 104 to the load 105 or between two points anywhere therebetween. The currents, $I_i$, may or may not be in series with each other. Two or more of the currents, $I_i$, can be identical to each other with less than 1, ±2%, or any other preset difference to a reference current value. Two or more of the currents, $I_i$, can be different from each other.

The differential voltage, $V_i$, e.g., the voltage drop, can be of any value that can be converted by the probe 107. For example, the differential voltage can be in the range of 0.1 millivolts, 1 millivolt, 10 millivolt, or 100 millivolts, to name just a few examples.

The probe 107 can be a voltage-to-current converter. The probe 107 can provide a gain or amplification while converting the differential voltage to current. The probe 107 can be an element that is not part of the PDN 103, but still physically located within the device 101. Each probe 107 can be configured to take the voltage drop and convert the respective differential voltage to a representative current, $I_{gmi}$, according to:

$$I_{gmi} = gm_i R_i I_i, \tag{2}$$

where i=1, . . . , n, and $gm_i$ is the gain or amplification of the probe. In some implementations, the gain or amplification $gm_i$ can be identical for each probe of the integrated current sensor 100, e.g., with a tolerable difference of less than ±1%, ±2%, or any other predetermined percentage from a reference gain or amplification. In some implementations, the gain or amplification of two or more probes 107 are different.

The integrated current sensor 100 can combine the currents, $I_{gmi}$, where i=1, . . . , n, into a measure of total current 108 within the current sensing block 102*a*. The measure of total current $I_{tot}$ can be determined as a sum of the output currents of the probes 107 according to:

$$I_{tot} = I_{gm1} + I_{gm2} \ldots + I_{gmn} \quad (3)$$

The integrated current sensor 100 can generate the measure of total current 108 as an input to the current processing block 102*b*, in particular, to the sensing capacitor 109. The measure of total current 108 can represent the electric current consumption of some or all portions of the load 105 at a particular time point, e.g., the portion(s) for which the current(s) are sensed by the integrated current sensor 100. The sensing capacitor 109 can integrate the measure of total current 108 for a predetermined period of time to produce the integrated voltage. Thus, the integrated voltage is indicative of electric current consumption of portions of the load 105 being sensed within the predetermined period of time.

Each probe can include a filter element that filters out high frequency component(s) or noise component(s) in the differential voltage. The filter element can be any electronic device that works within a predetermined voltage range and/or frequency range. For example, the filter element can be but is not limited to a chopper stabilization element, which can remove predetermined low frequency nose and offset from an amplifier.

The current processing block 102*b* can include a converter 110 that is configured to produce a measure of the integrated voltage indicative of the total current consumed by the device within the predetermined period of time. The converter 110 can take the integrated voltage as its input and samples it to generate a measure of current consumed by the device 101. The converter 110 can be an analog-to-digital converter (ADC). The ADC can digitize the integrated current and can generate a binary measure of current consumed based on the measure of total current 108 and the capacitance of the sampling capacitor 109. The sampling frequency of the converter can be customized, for example, to avoid aliasing of the integrated voltage being sensed.

The current processing block 102*b* can also include other electronic elements such as a switch. The switch 112 can open or close to disconnect or connect the current sensing block 102*a*, to the current processing block 102*b*, respectively. When the switch 112 is open, the current sensing block 102*a* is disconnected to the current processing block 102*b*. As a result, the total current 108 is not integrated at the sampling capacitor. When the switch is closed, the current sensing block 102*a* is connected to the current processing block 102*b*, and the total current 108 keeps integrating at the sensing capacitor to generate the corresponding integrated voltage.

The current processing block can include another switch 111. When the switch 111 is closed, it resets the sensing capacitor 109, and the voltage at the sampling capacitor ramps down to zero. As an example, the switch 111 can be closed periodically, and each time for a preset period of time. As another example, the switch 111 can close for a preset period of time after the converter completes sampling and digitizing the integrated voltage so that the sensing capacitor can be ready for subsequent integration and sensing. When the switch 111 is open, the current processing block 102*b* either integrates the total current 108 at the sensing capacitor 109 (when switch 112 is closed) or samples and digitizes the integrated current 113 at the converter 110 (when switch 112 is open).

Figure 3:
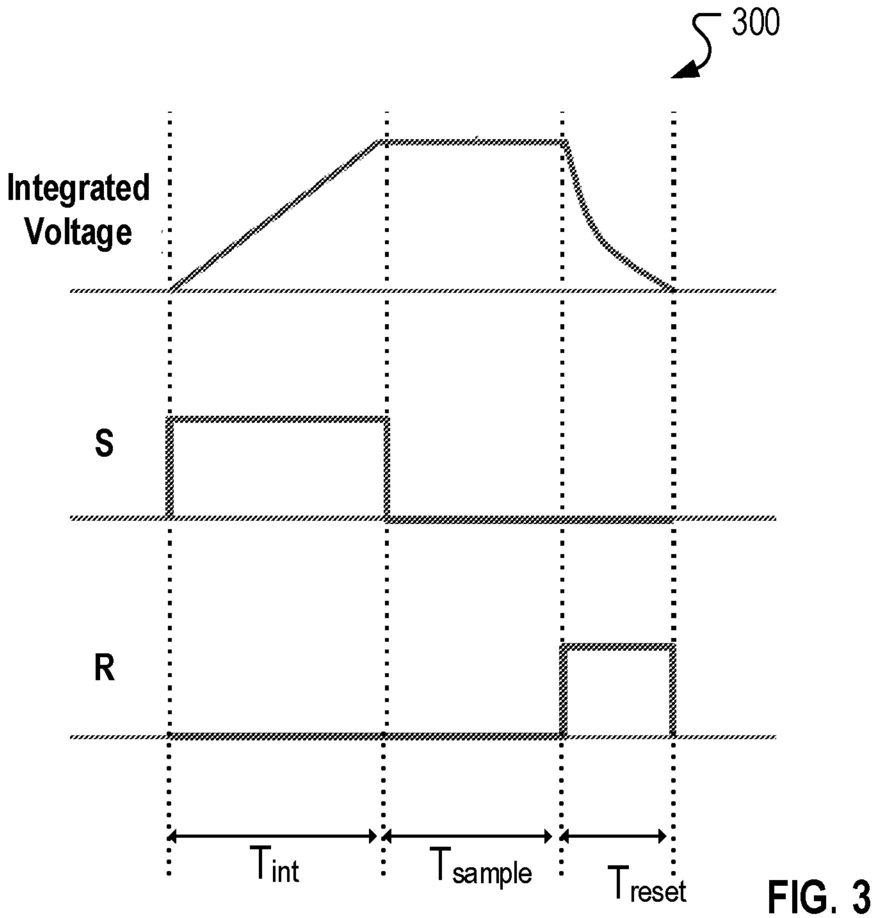
FIG. 3 is a timing diagram of an example current processing block of the integrated current sensor in FIG. 2.

FIG. 3 is a timing diagram of an example current processing block of the integrated current sensor in FIG. 2. The current processing block 102*b* can include three different phases. An integration phase can start after the sensing capacitor has been reset or the integrated voltage at the sensing capacitor is less than a preset value, e.g., 0.01 millivolts. In the integration phase, for a predetermined period of time, $T_{int}$, the capacitor 109 can integrate the total current 108 and provide an integrated voltage as an input to the converter, e.g., at the end of the predetermined period of time after the integration has been completed. Such input to the converter can be calculated as according to:

$$V_{int} = (I_{tot} T_{int})/C_s \quad (3)$$

where $T_{int}$ is the time duration of integration, $I_{tot}$ is the total current at a specific time point, and Cs is the capacitance of the sensing capacitor. The integrated voltage, $V_{int}$, can be proportional to the total current, so that the value of the integrated voltage can be a direct indication of the current consumption of at least the measured portion of the load. Equation (3) is used when $I_{tot}$ remains constant or its fluctuation can be ignored, e.g., the fluctuation is less than ±1%, ±5%, or 10% of a reference current. When the total current, $I_{tot}$, fluctuates during the integration period of time, equation (3) can be expressed as an integration of $I_{tot}$ over the predetermined integration period of time, $T_{int}$. The capacitance, $C_s$, can be predetermined based on the particular functions that the devices perform during the time the currents are measured. The capacitance, $C_s$, can also be predetermined based on other factors including but are not limited to the ranges of $I_{tot}$, $T_{int}$, $V_{int}$, or their combinations. An exemplary range of capacitance can be from 100 femtofarad (fF) to 10 picofarad (pF).

During the integration phase, the switch 112, S, remains closed. The predetermined period of time can be set based on the computational task(s) being performed at the device. For example, if it is known that the current consumption will spike and fluctuate repeatedly in every 10 milliseconds for a computational task, the predetermined period of time can be set to be no less than 10 millisecond so that the integration can be a representation of average current consumption for performing the computational task. The switch 111, $R_c$, remains open during the integration phase.

A sampling phase can immediately follow the integration phase. In the sampling phase, the converter 110 can sample and output a digitized signal. The digitized signal can be a measure of current consumption of a sensed portion of the load 105 in the device 101. The digitized signal can be a binary signal. The binary signal can be of preset precision. For example, the binary signal can include 8 bits, 16 bits, or even 32 bits. The digitized signal can represent the measured current consumption during the integration phase.

The sampling phase can be set to last a time duration of $T_{sample}$ milliseconds. The time duration of the sampling phase can be predetermined or adjusted depending on the computational task(s) that the load performs during current sensing. During the sampling phase, the switch 112, S, is open so that the current sensing block 102*a* is disconnected from the current processing block 102*b* and the integrated voltage remains a plateau. The switch 111, $R_c$, is also open during the sampling phase.

After the converter 110 integrates, samples and digitizes the integrated voltage to generate an output in the sampling phase, the switch 111, $R_c$, is closed to reset the sensing capacitor 109 in a reset phase. During the reset phase, the integrated voltage is ramped down to zero. A reset phase can immediately follow the sampling phase. The reset phase can occur prior to an integration phase. Alternatively, the reset phase can be used whenever there is a need to rest the voltage at the sensing capacitor to zero. The reset phase can last for $T_{reset}$ milliseconds.

FIG. 3 shows an exemplary sequence of the different phases at the current processing block 102*b*. However, different arrangements of the three phases can be utilized whenever necessary. For example, a reset phase can immediately follow an integration phase, even after an incomplete integration, to reset the capacitor 109 before any sampling by the converter 110.

One or more of the three different phases herein can be completed phases in which the corresponding time of the phase has passed or the particular function, e.g., integration, sampling, has been completed. The three different phases herein can include zero or more incomplete phases in which the corresponding time of the phase has not passed or the corresponding function, e.g., integration, sampling, has not been completed.

The integrated current sensor 100 can be timed to enter a next phase within a predetermined sequence of phases with a predetermined time schedule. For example, each integration phase can last 12 milliseconds and followed by a sampling and digitizing phase that lasts 10 milliseconds. Alternatively, the integrated current sensor can be triggered to enter a subsequent phase when a threshold condition has been satisfied. For example, when the ADC has generated x digitized samples, it triggers the start of the reset phase.

Figure 4:
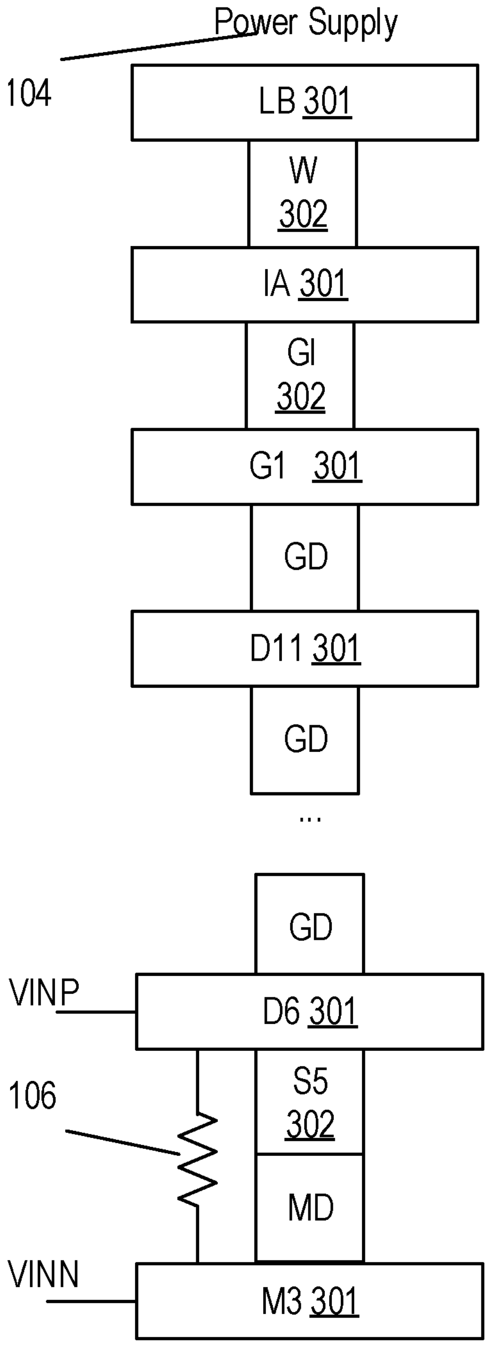
FIG. 4 is a diagram of an example cross-section of a power delivery network with a sensing resistor of the integrated current sensors disclosed herein.

FIG. 4 is a diagram of an example cross-section of a PDN with a sensing resistor of the integrated current sensors disclosed herein. The PDN 103 can include a plurality of metal layers 301 stacked together. Adjacent layers can include via(s) 302 in between, which are conduction pathway(s) between the layers 301. The PDN 103 connects the load to the external power supply 104. One of the resistors 106 between the D6 layer and the M3 layer can be selected as a resistor of the integrated current sensor 100. The voltage drop being sensed is the differential voltage between VINP and VINN.

To measure and estimate current consumption of the device by the integrated current sensor, differential voltages within the PDN can be selected according to a spatial sampling plan. The spatial sampling plan can determine: how many resistors or differential voltages are sampled, where they are located, which part of the device they deliver power to, or a combination thereof. For example, one sampling plan can include sensing and converting every single differential voltage that meets a minimal converting threshold of the probe, e.g., every single differential voltage that is greater than 0.2 millivolts. As another example, a sampling plan can include sensing and converting differential voltages with a maximal spacing between two adjacent differential voltages, e.g., no greater than 100 microns or 50 microns. As yet another example, a sampling plan can be customized based on the particular function or computational task for which the current consumption is being measured. The spatial sampling plan can also be predetermined to specifically cover "hot spots," "cold spots" of power consumption of the device. Such "spots" can be determined based on thermal information or power consumption information with respect to spatial locations within the device. In some cases, a spatial sampling plan is determined to ensure the current measurement error is less than ±10%, ±8%, +5%, or any other preset relative error percentages relative to the current consumption of the load. In some cases, a spatial sampling plan is determined to ensure the currents of greater than 50% or any other percentage of the load is measured.

Figure 5:
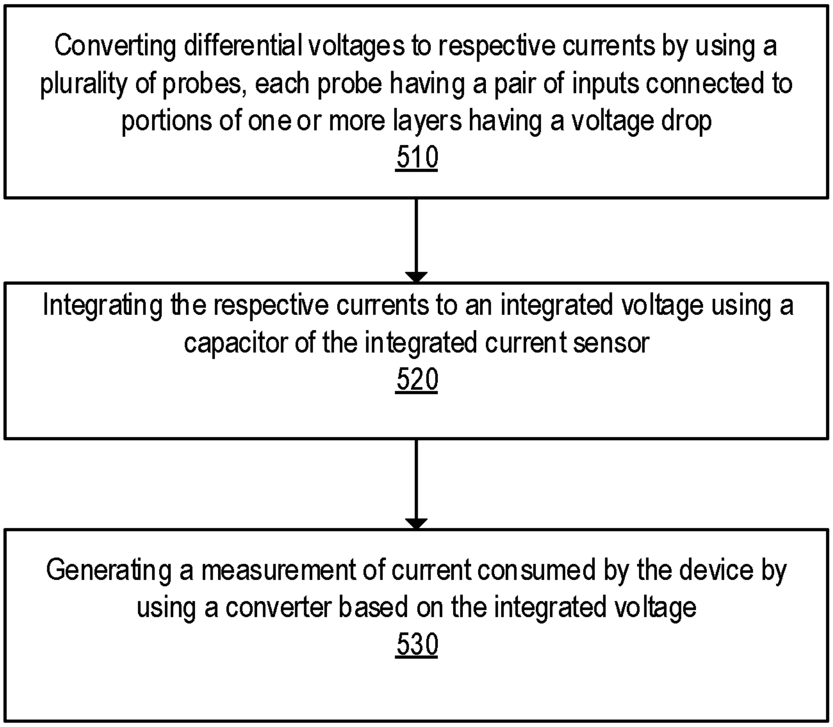
FIG. 5 is a flowchart for an example process for sensing and measuring currents of the device using the integrated current sensor in FIG. 2.

FIG. 5 is a flowchart for an example process for sensing electronic current consumption of a device. Additional detail for implementing an integrated current sensor that can perform the process in FIG. 3 can be found in the description of FIG. 1 and FIG. 2, above. The example process can be performed by any appropriate electronic device and will be described as being performed by an integrated current sensor, e.g., the integrated current sensor described above with reference to FIG. 2.

The integrated current sensor can convert differential voltages to respective currents by using a plurality of probes, each probe having a pair of inputs connected to portions of one or more metal layers having a voltage drop (510). As discussed above with reference to FIG. 1 and FIG. 2, differential voltages are created by resistors within the existing PDN of the device, without the need to add additional current sensing elements to the device. Also as discussed above, the probes are configured to convert small differential voltages, e.g., in the range of 0.1 millivolts to 2 volts, into currents that can be combined and integrated for generating a sensing result. The probes can amplify the output current(s) with a predetermined amplification. The differential voltages or the resistance do not need to be identical for the probes to properly convert differential voltages to currents.

Subsequent to the converting step, the integrated current sensor can combine the converted currents and integrate the respective currents using a capacitor (520) over a predetermined period of time and generate an integrated voltage. The converted currents, e.g., in parallel, are combined together and are integrated as discussed in FIGS. 2-3 to represent a total current or an average current consumption including possible spikes and fluctuations over a predetermined period of time. The predetermined period of time can be based on the task(s) for which the current consumption needs to be measured.

The integrated current sensor can then generate a measurement or estimation of the current consumed by the device by using a converter to sample and digitize the integrated voltage (530). As discussed above with reference to FIGS. 2-3, the integrated current sensor can sample the integrated voltage in the sampling phase which follows a completed integration phase. The sampled current is then digitized to produce a digital signal representing the current consumption of the measured portion of the device. Depending on the spatial sampling plan, e.g., a number of resistors or differential voltages being sampled, the spatial location of the resistors within the PDN, and regions of the device the resistors are in electronic communication with, the total current consumption of the entire device can be computed.

Embodiments of the subject matter and the functional operations described in this specification can be implemented in digital electronic circuitry and in computer hardware, including the structures disclosed in this specification and their structural equivalents, or in combinations of one or more of them.

The term "load" refers to power consuming hardware and encompasses all kinds of electronic elements, devices, and machines for performing function(s) of the device, including by way of example logic circuitry, e.g., an FPGA (field programmable gate array) or an ASIC (application-specific integrated circuit).

The processes and logic flows described in this specification can be performed by one or more electronic components of an integrated circuitry that perform functions by operating on input data and generating output.

To provide for interaction with a user, embodiments of the subject matter described in this specification can be implemented on a host device having a display device, e.g., a CRT (cathode ray tube) or LCD (liquid crystal display) monitor, for displaying information to the user and a keyboard and pointing device, e.g., a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

In addition to the embodiments described above, the following embodiments are also innovative:

Embodiment 1 is a device having integrated current sensors, the device comprising:

a plurality of layers within a power delivery network of the device, each tile comprising circuitry for performing one or more functions; a plurality of probes, each probe having a pair of inputs connected to portions of one or more layers having a voltage drop, wherein each probe is configured to convert a respective differential voltage to a representative current passing through the one or more layers; a capacitor that is configured to integrate the respective currents passing through the one or more layers to an integrated voltage; and a converter that is configured to generate a measure of current consumed by the device based on the integrated voltage.

Embodiment 2 is the device having integrated current sensors in embodiment 1, wherein the one or more functions comprise delivery of power from a power supply to a load of the device, and wherein the plurality of probes are configured to facilitate power delivery from a power supply to the load and contribute to a voltage drop.

Embodiment 3 is the device having integrated current sensors in embodiment 1, wherein the differential voltages measured by the probes are part of the plurality of layers.

Embodiment 4 is the device having integrated current sensors in embodiment 1, wherein the respective differential voltage is in the range of 0.1 millivolts to 2 millivolts.

Embodiment 5 is the device having integrated current sensors in embodiment 1, wherein the plurality of probes is selected based on a predetermined spatial sampling plan, and wherein the predetermined spatial sampling plan is determined based on a computational need of the device.

Embodiment 6 is the device having integrated current sensors in embodiment 1, wherein a minimal distance between two adjacent probes of the plurality of probes is no greater than 100 micron.

Embodiment 7 is the device having integrated current sensors in embodiment 1, wherein each of the plurality of probes is a voltage-to-current converter.

Embodiment 8 is the device having integrated current sensors in embodiment 1, wherein each of the plurality of probes is configured to filter out high frequency components in the respective differential voltage.

Embodiment 9 is the device having integrated current sensors in embodiment 1, wherein the converter is an analog-to-digital converter.

Embodiment 10 is the device having integrated current sensors in embodiment 9, wherein the converter is configured to sample the integrated voltage with a sampling rate of no less than 100 times per second.

Embodiment 11 is a method of sensing one or more currents of a device, the method comprising: generating differential voltages at portions of one or more layers within a power delivery network of the device, each layer comprising circuitry for performing one or more functions, wherein a plurality of probes are connected to the portions of the one or more layers, and wherein each probe have a pair of inputs; converting, by the plurality of probes, the differential voltages to respective currents; integrating, by a capacitor, the respective currents to an integrated voltage; and generating, by a converter, a measurement of current consumed by the device based on the integrated voltage.

Embodiment 12 is the method in embodiment 11, wherein the one or more functions comprise delivery of power from a power supply to a load of the device, and wherein the plurality of probes are configured to facilitate power delivery from the power supply to the load and contribute to a voltage drop.

Embodiment 13 is the method in embodiment 11, wherein the differential voltages measured by the probes are part of the one or more layers.

Embodiment 14 is the method in embodiment 11, wherein the respective differential voltage is in a range of 0.1 millivolts to 2 millivolts.

Embodiment 15 is the method in embodiment 11, wherein the plurality of probes is selected based on a predetermined spatial sampling plan, and wherein the predetermined spatial sampling plan is determined based on a computational need of the device.

Embodiment 16 is the method in embodiment 11, wherein a minimal distance between two adjacent probes of the plurality of probes is no greater than 100 micron.

Embodiment 17 is the method in embodiment 11, wherein each of the plurality of probes is a voltage-to-current converter.

Embodiment 18 is the method in embodiment 11, wherein each of the plurality of probes is configured to filter out high frequency components in the respective differential voltage.

Embodiment 19 is the method in embodiment 11, wherein converting, by the plurality of probes, the differential voltages to respective currents comprises using an analog-to-digital converter to covert the differential voltages to respective currents.

Embodiment 20 is the method in embodiment 11, wherein converting, by the plurality of probes, the differential voltages to respective currents comprises sampling the integrated voltage with a sampling rate of no less than 100 times per second.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain cases, multitasking and parallel processing may be advantageous.

What is claimed is:

1. A device having one or more integrated current sensors, the device comprising:

a plurality of layers within a power delivery network of the device, each layer comprising circuitry for performing one or more functions;

a plurality of probes, each probe having a pair of inputs connected to portions of one or more layers having a voltage drop, wherein each probe is configured to convert a respective differential voltage to a representative current passing through the one or more layers;

a capacitor that is configured to integrate the respective currents passing through the one or more layers to an integrated voltage; and a converter that is configured to generate a measure of current consumed by the device based on the integrated voltage.

2. The device of claim 1, wherein the one or more functions comprise delivery of power from a power supply to a load of the device, and wherein the plurality of probes are configured to facilitate power delivery from the power supply to the load and contribute to a voltage drop.

3. The device of claim 1, wherein the differential voltages measured by the plurality of probes are part of the plurality of layers.

4. The device of claim 1, wherein the respective differential voltage is in a range of 0.1 millivolts to 2 millivolts.

5. The device of claim 1, wherein the plurality of probes is selected based on a predetermined spatial sampling plan, and wherein the predetermined spatial sampling plan is determined based on a computational need of the device.

6. The device of claim 1, wherein a minimal distance between two adjacent probes of the plurality of probes is no greater than 100 micron.

7. The device of claim 1, wherein each of the plurality of probes is a voltage-to-current converter.

8. The device of claim 1, wherein each of the plurality of probes is configured to filter out high frequency components in the respective differential voltage.

9. The device of claim 1, wherein the converter is an analog-to-digital converter.

10. The device of claim 1, wherein the converter is configured to sample the integrated voltage with a sampling rate of no less than 100 times per second.

11. A method of sensing one or more currents of a device, the method comprising:

generating differential voltages at portions of one or more layers within a power delivery network of the device, each layer comprising circuitry for performing one or more functions, wherein a plurality of probes are connected to the portions of the one or more layers, and wherein each probe have a pair of inputs;

converting, by the plurality of probes, the differential voltages to respective currents;

integrating, by a capacitor, the respective currents to an integrated voltage; and generating, by a converter, a measurement of current consumed by the device based on the integrated voltage.

12. The method of claim 11, wherein the one or more functions comprise delivery of power from a power supply to a load of the device, and wherein the plurality of probes are configured to facilitate power delivery from the power supply to the load and contribute to a voltage drop.

13. The method of claim 11, wherein the differential voltages measured by the probes are part of the one or more layers.

14. The method of claim 11, wherein the respective differential voltage is in a range of 0.1 millivolts to 2 millivolts.

15. The method of claim 11, wherein the plurality of probes is selected based on a predetermined spatial sampling plan, and wherein the predetermined spatial sampling plan is determined based on a computational need of the device.

16. The method of claim 11, wherein a minimal distance between two adjacent probes of the plurality of probes is no greater than 100 micron.

17. The method of claim 11, wherein each of the plurality of probes is a voltage-to-current converter.

18. The method of claim 11, wherein each of the plurality of probes is configured to filter out high frequency components in the respective differential voltage.

19. The method of claim 11, wherein converting, by the plurality of probes, the differential voltages to respective currents comprises using an analog-to-digital converter to covert the differential voltages to respective currents.

20. The method of claim 11, wherein converting, by the plurality of probes, the differential voltages to respective currents comprises sampling the integrated voltage with a sampling rate of no less than 100 times per second.

* * * * *